(12) United States Patent
Inaba et al.

(10) Patent No.: US 12,027,936 B2
(45) Date of Patent: Jul. 2, 2024

(54) LINEAR MOTOR AND LINEAR HEAD MODULE

(71) Applicant: SANYO DENKI CO., LTD., Tokyo (JP)

(72) Inventors: Satoshi Inaba, Tokyo (JP); Yuki Onda, Tokyo (JP); Yasushi Misawa, Tokyo (JP)

(73) Assignee: SANYO DENKI CO., LTD., Tokyo (JP)

( * ) Notice: Subject to any disclaimer, the term of this patent is extended or adjusted under 35 U.S.C. 154(b) by 157 days.

(21) Appl. No.: 17/747,621

(22) Filed: May 18, 2022

(65) Prior Publication Data

US 2022/0399793 A1 Dec. 15, 2022

(30) Foreign Application Priority Data

Jun. 11, 2021 (JP) ................................. 2021-098055

(51) Int. Cl.
*H02K 41/03* (2006.01)
*H02K 7/08* (2006.01)
*H02K 11/21* (2016.01)

(52) U.S. Cl.
CPC ............ *H02K 41/031* (2013.01); *H02K 7/08* (2013.01); *H02K 11/21* (2016.01); *H02K 2211/03* (2013.01)

(58) Field of Classification Search
CPC ...... H02K 41/02; H02K 41/03; H02K 41/031; H02K 11/21; H02K 7/08; H02K 2211/03; G03F 7/70775

(Continued)

(56) References Cited

U.S. PATENT DOCUMENTS 6,573,708 B1 6/2003 Hiramatsu et al.
7,453,172 B2 * 11/2008 Yajima ............... H02K 41/0352
310/12.24

(Continued)

FOREIGN PATENT DOCUMENTS

CN 112217370 A 1/2021
EP 2541744 A2 1/2013

(Continued)

OTHER PUBLICATIONS

Extended European Search Report (EESR) dated Nov. 16, 2022 for European Patent Application No. 22172996.5.

*Primary Examiner* — Burton S Mullins
(74) *Attorney, Agent, or Firm* — RANKIN, HILL & CLARK LLP

(57) ABSTRACT

A linear motor includes: a mover including an output shaft portion extending in a direction of a thrust axis; a detection portion configured to be capable of detecting a position of the output shaft portion in the direction of the thrust axis; and a detected portion fixed to the mover, the mover further includes: a mounting base to which the detected portion is attached; and a metal fastening member that fastens the mounting base to an end surface, on one side in the direction of the thrust axis, of the output shaft portion, and the mounting base includes: a metal fastened portion sandwiched between the end surface, on the one side in the direction of the thrust axis, of the output shaft portion, and the fastening member; and a resin mounting portion having a mounting surface to which the detected portion is attached, the mounting surface being provided at a position off the thrust axis.

7 Claims, 7 Drawing Sheets

(58) Field of Classification Search
USPC .................................................. 310/12.01
See application file for complete search history.

(56) References Cited

U.S. PATENT DOCUMENTS

| | | | | |
|---|---|---|---|---|
| 8,368,259 | B2* | 2/2013 | Sakai | H02K 15/16 |
| | | | | 310/12.33 |
| 8,941,271 | B2* | 1/2015 | Tsuri | H02K 11/21 |
| | | | | 310/12.33 |
| 9,281,734 | B2* | 3/2016 | Tang | H02K 41/031 |
| 9,370,793 | B2* | 6/2016 | Utsumi | H05K 13/0413 |
| 10,267,298 | B2* | 4/2019 | Utsumi | H02K 41/031 |
| 2009/0218894 | A1 | 9/2009 | Aso et al. | |
| 2012/0326533 | A1* | 12/2012 | Tang | H02K 41/031 |
| | | | | 310/12.24 |
| 2014/0292110 | A1 | 10/2014 | Tang et al. | |
| 2014/0319934 | A1* | 10/2014 | Tang | H02K 5/12 |
| | | | | 310/12.14 |
| 2016/0087515 | A1* | 3/2016 | Makino | H02K 41/031 |
| | | | | 310/12.14 |

FOREIGN PATENT DOCUMENTS

| | | | | |
|---|---|---|---|---|
| EP | 2784920 | A2 | 10/2014 | |
| JP | 2002005693 | A * | 1/2002 | ............ B41J 19/207 |
| JP | 5393952 | B2 | 1/2014 | |
| JP | 2014-192959 | A | 10/2014 | |

\* cited by examiner

LINEAR MOTOR AND LINEAR HEAD MODULE

CROSS-REFERENCE TO RELATED APPLICATION

This application is based on Japanese Patent Application No. 2021-098055 filed with the Japan Patent Office on Jun. 11, 2021, the entire content of which is hereby incorporated by reference.

BACKGROUND

1. Technical Field

One aspect of the present disclosure relates to a linear motor and a linear head module.

2. Description of the Related Art

A linear head module described in JP-A-2014-192959 is known.

SUMMARY

A linear motor includes: a mover including an output shaft portion extending in a direction of a thrust axis; a detection portion configured to be capable of detecting a position of the output shaft portion in the direction of the thrust axis; and a detected portion fixed to the mover. The mover further includes: a mounting base to which the detected portion is attached; and a metal fastening member that fastens the mounting base to an end surface, on one side in the direction of the thrust axis, of the output shaft portion. The mounting base includes: a metal fastened portion sandwiched between the end surface, on the one side in the direction of the thrust axis, of the output shaft portion, and the fastening member; and a resin mounting portion having a mounting surface to which the detected portion is attached, the mounting surface being provided at a position off the thrust axis.

DETAILED DESCRIPTION

Figure 1:
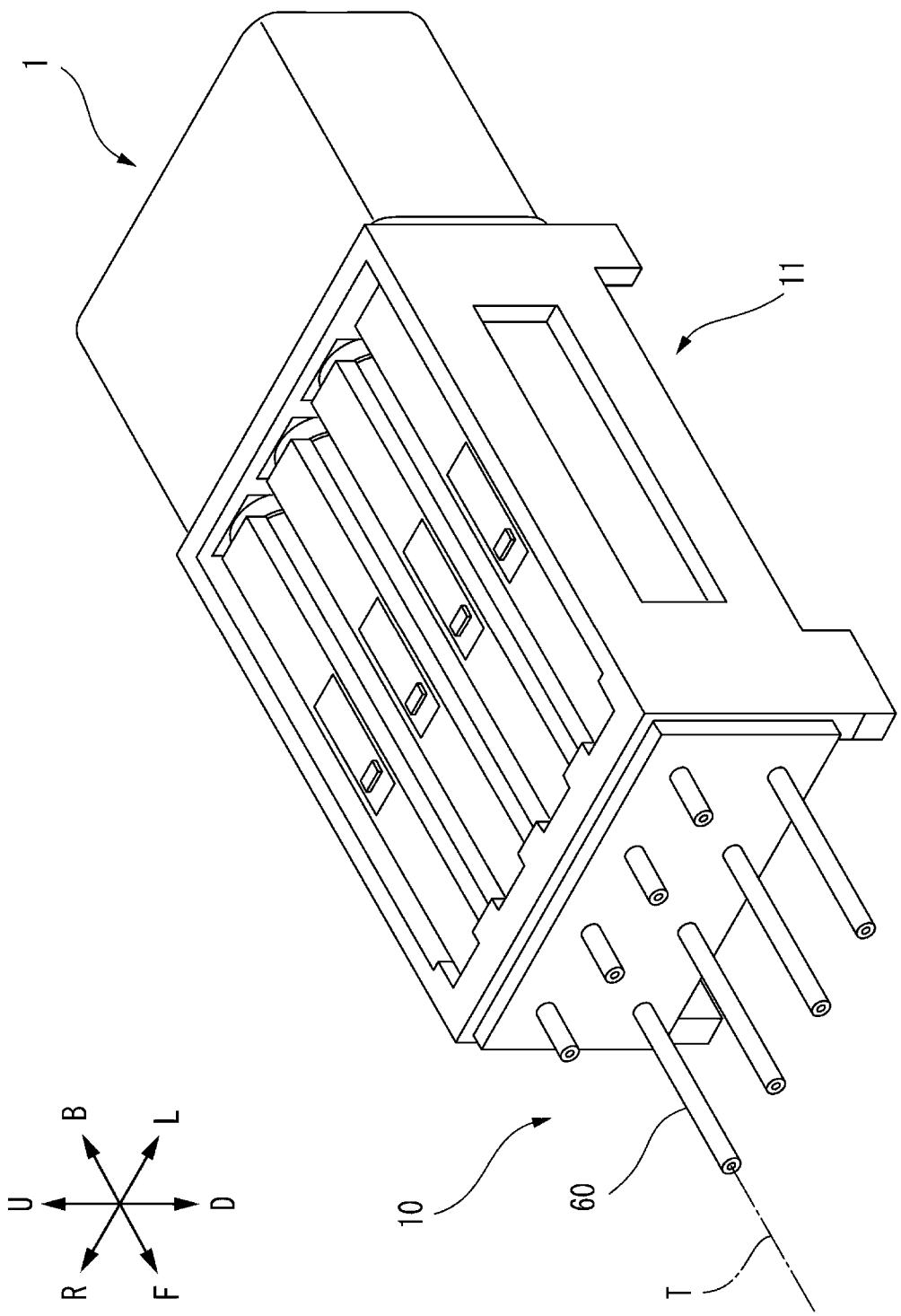
FIG. 1 is a perspective view of a linear head module according to an embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The linear head module described in JP-A-2014-192959 includes a plurality of linear motors. A block member is connected to an output shaft portion, which extends along the thrust axis, of a mover of the linear motor. An extension member is screwed to the block member.

In the linear head module described in JP-A-2014-192959, a screw extending in a twisted direction relative to the direction of the thrust axis fixes the extension member to the block member at a position away from the output shaft portion. When the mover accelerates or stops rapidly, a large force of inertia acts on the extension member along the direction of the thrust axis. The screw can receive the force of inertia at a shank thereof. Hence, the design of the apparatus described in JP-A-2014-192959 is rational.

In recent years, an increase in the speed of the mover has been increasingly required. When rapid acceleration or deceleration acts on the mover in the linear head module that requires operating at high speeds, a large force of inertia also acts on the metal screw in the apparatus described in JP-A-2014-192959. When a large force of inertia acts on the screw, a large force in a direction crossing the direction of the thrust axis may act on the output shaft to produce an undue load on a bearing supporting the output shaft portion.

One object of the present disclosure is to provide a linear motor that resists producing an undue force on a bearing supporting an output shaft portion, and a linear head module including the linear motor.

A linear motor according to one aspect of the present disclosure (the present linear motor) includes: a mover including an output shaft portion extending in a direction of a thrust axis; a detection portion configured to be capable of detecting a position of the output shaft portion in the direction of the thrust axis; and a detected portion fixed to the mover. The mover further includes: a mounting base to which the detected portion is attached; and a metal fastening member that fastens the mounting base to an end surface, on one side in the direction of the thrust axis, of the output shaft portion. The mounting base includes: a metal fastened portion sandwiched between the end surface, on the one side in the direction of the thrust axis, of the output shaft portion, and the fastening member; and a resin mounting portion having a mounting surface to which the detected portion is attached, the mounting surface being provided at a position off the thrust axis.

A linear head module according to one aspect of the present disclosure includes: a plurality of the present linear motors described above; and a housing configured to support the movers in such a manner as to be movable in the direction of the thrust axis. The housing includes a counter-output-side support wall, and the counter-output-side support wall is provided on the one side in the direction of the thrust axis, extends in a direction crossing the thrust axis, and supports the movers in such a manner as to be movable in the direction of the thrust axis. The counter-output-side support wall is provided with through-holes through each of which at least a part of the respective mounting portion is insertable.

According to the above aspect of the present disclosure, the linear motor that resists producing the undue force on the bearing supporting the output shaft portion, and the linear head module including the linear motor are provided.

An embodiment of the present disclosure is described hereinafter with reference to the drawings. Descriptions of members having the same reference numerals as members that have already been described in the detailed description are omitted for the convenience of description. Moreover, the dimensions of each member illustrated in the drawings may be different from actual dimensions thereof for the convenience of description.

FIG. 1 is a perspective view of a linear head module 1 including linear motors 10 according to the embodiment of the present disclosure. In FIG. 1, a reference sign F indicates front, a reference sign B back, a reference sign U up, a reference sign D down, a reference sign R right, and a reference sign L left.

In the following description, the "left-and-right direction", the "front-and-back direction", and the "up-and-down direction" are mentioned as appropriate for the convenience of description. The "up-and-down direction" is a direction including the "upward direction" and the "downward direction." The "front-and-back direction" is a direction including the "forward direction" and the "backward direction". The "left-and-right direction" is a direction including the "leftward direction" and the "rightward direction". In the following description, the direction of a thrust axis T in the linear head module 1 is referred to as the front-and-back direction.

Figure 2:
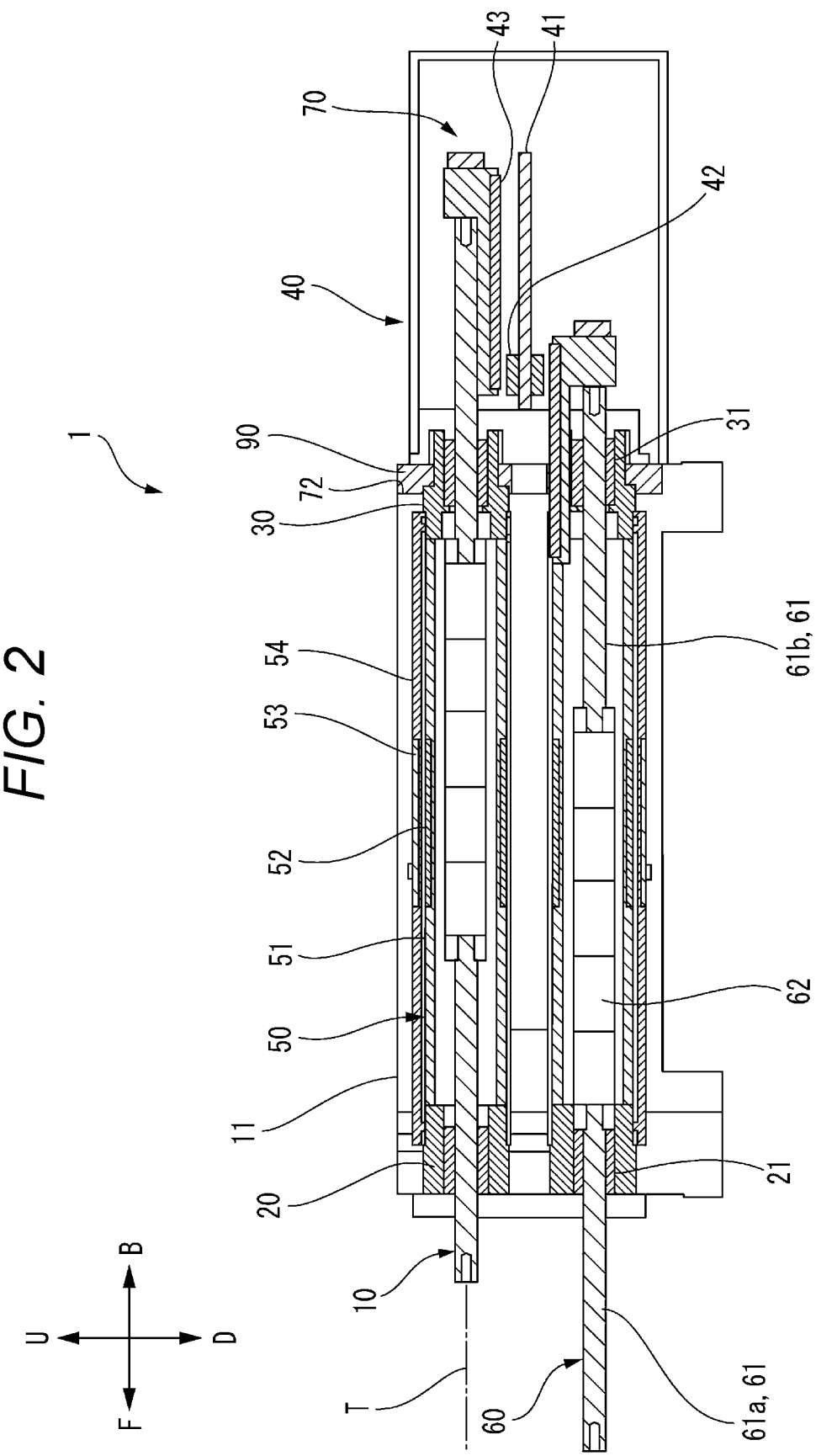
FIG. 2 is a cross-sectional view of the linear head module.

As illustrated in FIG. 1, the linear head module 1 includes the plurality of linear motors 10 each including a mover 60 that moves in the front-and-back direction (the direction of thrust), a housing 11, and a sensor unit 40 (refer to FIG. 2). In the illustrated example, the linear head module 1 includes eight linear motors 10. Four linear motors 10 are arranged in the left-and-right direction in the upper row. Four linear motors 10 are arranged in the left-and-right direction in the lower row.

FIG. 2 is a cross-sectional view of the linear head module 1. FIG. 2 is a diagram of the linear head module 1 as viewed in cross section that extends in the front-and-back direction and in the up-and-down direction. As illustrated in FIG. 2, each of the linear motors 10 includes a stator 50 fixed to the housing 11, and the mover 60 that can move relative to the stator 50 in the front-and-back direction.

The mover 60 includes an output shaft portion 61 extending in the front-and-back direction, and magnets 62. The plurality of magnets 62 is arranged in a line in the front-and-back direction, and is coupled to one another. The output shaft portion 61 is a rod-shaped member extending in the front-and-back direction. The output shaft portion 61 includes a front output shaft portion 61a provided forward of the magnets 62, and a back output shaft portion 61b provided backward of the magnets 62. A front part of the front output shaft portion 61a is connected to a drive target object that is desired to be driven by the linear head module 1.

The stator 50 includes a back yoke 51 and coils 52. In the illustrated example, the stator 50 further includes a drive circuit board 53 that supplies power to the coils 52 and controls the coils 52, and a cover 54 where the drive circuit board 53 is housed. The stator 50 is fixed to the housing 11.

The back yoke 51 is a member mainly including a magnetic material such as iron. In the illustrated example, the back yoke 51 is a cylindrical member extending along the output shaft portion 61. The output shaft portion 61 is housed in the cylindrical back yoke 51 in such a manner as to be movable in the front-and-back direction. Moreover, the plurality of coils 52 is provided in the cylindrical (cylinder type) back yoke 51. The coil 52 is formed by winding an electric wire into a shape of a tube centered around an axis extending in the front-and-back direction. The back yoke 51 causes lines of magnetic flux generated by the coil 52 to converge, and increases magnetic force.

An electric wire extending from a power supply (neither is illustrated) is connected to the drive circuit board 53. The drive circuit board 53 is housed in the plate-shaped cover 54 that is provided on an outer peripheral side of the cylindrical back yoke 51 to house the drive circuit board 53. An electric wire extends from the drive circuit board 53 to the coil 52. The drive circuit board 53 supplies power to the coil 52 via the electric wire. The drive circuit board 53 controls the direction of flow of and the amount of current to be supplied to the coil 52. Therefore, the direction and strength of magnetic lines of force generated around the coil 52 are controlled. Consequently, the drive circuit board 53 controls the direction and speed of the movement of the output shaft portion 61.

As illustrated in FIG. 2, the stator 50 includes a first bearing holder 20. The first bearing holder 20 is attached to the housing 11, and supports an output-side end portion of the back yoke 51 of the stator 50. The first bearing holder 20 is provided to the output-side end portion of the back yoke 51. The first bearing holder 20 includes a first bearing 21 that supports the output shaft portion 61 in such a manner as to be movable in the front-and-back direction.

The stator 50 includes a second bearing holder 30. The second bearing holder 30 is attached to the housing 11, and supports a counter-output-side end portion of the back yoke 51 of the stator 50. The second bearing holder 30 is provided to the counter-output-side end portion of the back yoke 51. The second bearing holder 30 includes a second bearing 31 that supports the output shaft portion 61 in such a manner as to be movable in the front-and-back direction.

In other words, the housing 11 supports the mover 60 via the first bearing 21 and the second bearing 31 in such a manner as to be movable in the direction of the thrust axis T.

The sensor unit 40 detects the position of the output shaft portion 61 in the direction of the thrust axis T. The sensor unit 40 includes a sensing circuit board 41 (a circuit board), a detection portion 42, and a detected portion 43 fixed to the mover 60. The sensing circuit board 41 is fixed to the housing 11. The detection portion 42 is mounted on the sensing circuit board 41. Hence, the detection portion 42 cannot move relative to the housing 11.

The sensor unit 40 in the embodiment is configured as an optical sensor. The detection portion 42 includes a light emitting portion and a light receiving portion. Light emitted from the light emitting portion is reflected by the detected portion 43. The light receiving portion detects the reflected light. In the detected portion 43, reflective portions with a predetermined width and non-reflective portions (or slits) with a lower reflectivity than the slit reflective portion are alternately arranged along the direction of the thrust axis T. When the output shaft portion 61 moves in the direction of the thrust axis T, the detection portion 42 detects or does not detect the reflected light. Consequently, the output of the detection portion 42 changes. The position of the output shaft portion 61 in the direction of the thrust axis T can be identified on the basis of the change in the output of the detection portion 42.

Figure 3:
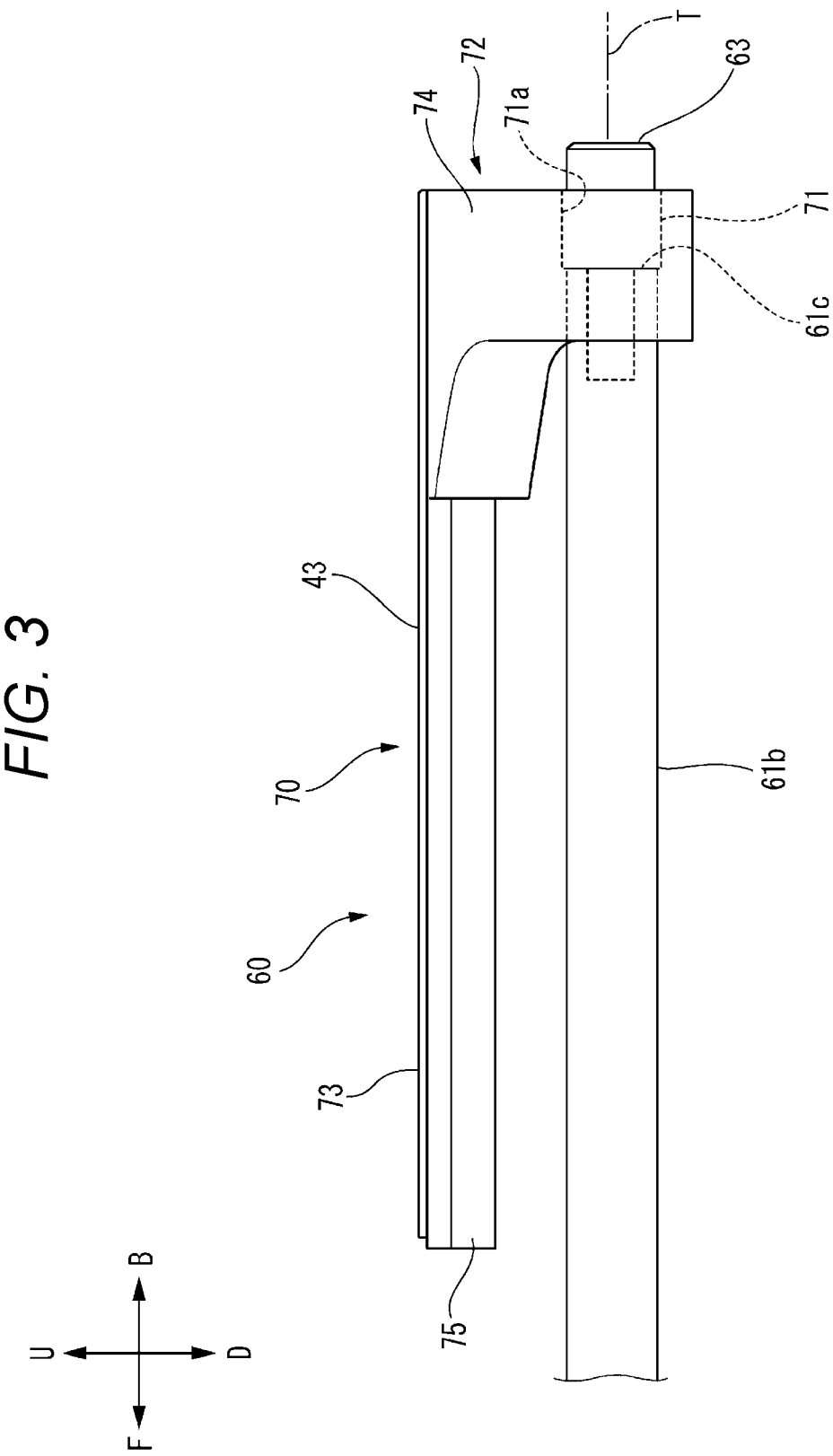
FIG. 3 is an enlarged view illustrating a back output shaft portion of a mover.

FIG. 3 is an enlarged view illustrating the back output shaft portion 61b of the mover 60. As illustrated in FIG. 3, the mover 60 includes the back output shaft portion 61b (the output shaft portion), a mounting base 70 to which the detected portion 43 is attached, and a metal fastening member 63 that fastens the mounting base 70 to the back output shaft portion 61b. In the illustrated example, the fastening member 63 is a bolt having a threaded portion and a head. The fastening member 63 is screwed in a counter-output-side end surface 61c of the back output shaft portion 61b in the direction of the thrust axis T. The counter-outputside end surface 61c of the back output shaft portion 61b is provided with a screw hole having a threaded inner peripheral surface. The fastening member 63 is screwed in the screw hole.

The mounting base 70 includes a metal fastened portion 71 and a resin mounting portion 72. The fastened portion 71 is sandwiched between the counter-output-side end surface 61c of the back output shaft portion 61b and the head of the fastening member 63. The fastened portion 71 is a cylindrical member, and includes a through-hole 71a penetrating in the direction of the thrust axis T. The fastening member 63 is inserted through the through-hole 71a. The diameter of the through-hole 71a is larger than the diameter of the threaded portion of the fastening member 63, and is smaller than the diameter of the head of the fastening member 63. The counter-output-side end surface of the fastened portion 71 is in contact with the head of the fastening member 63.

The mounting portion 72 includes a mounting surface 73 where the detected portion 43 is attached. The mounting surface 73 is provided at a position off the thrust axis T. The mounting surface 73 extends parallel to the thrust axis T.

In other words, the linear motor 10 according to the embodiment includes the mover 60 having the output shaft portion 61 extending in the direction of the thrust axis T, the detection portion 42 that can detect the position of the output shaft portion 61 in the direction of the thrust axis T, and the detected portion 43 fixed to the mover 60. The mover 60 further includes the mounting base 70 where the detected portion 43 is attached, and the metal fastening member 63 that fastens the mounting base 70 to the end surface 61c, on one side in the direction of the thrust axis T, of the output shaft portion 61. The mounting base 70 includes: the metal fastened portion 71 sandwiched between the end surface 61c, on the one side in the direction of the thrust axis T, of the output shaft portion 61 and the fastening member 63; and the resin mounting portion 72 including the mounting surface 73 where the detected portion 43 is attached, the mounting surface 73 being provided at the position off the thrust axis T.

In the linear motor 10 according to the embodiment, the mounting portion 72 mainly includes a lightweight resin and has the mounting surface 73 where the detected portion 43 is attached, the mounting surface 73 being provided at the position off the thrust axis T. Hence, even if the mover 60 accelerates or decelerates rapidly, the force of inertia produced on the mover 60 can be limited to a small magnitude.

Furthermore, the metal fastening member 63 is fastened to the counter-output-side end surface 61c of the back output shaft portion 61b. Hence, the mover 60 resists producing a large moment of inertia in a direction away from the thrust axis T. Therefore, an undue force hardly acts on the first bearing 21 and the second bearing 31 that support the output shaft portion 61. In contrast to the embodiment, in the configuration of JP-A-2014-192959, a linear guide that supports a metal mounting base in such a manner as to be movable is provided to a housing to receive the moment of inertia. Such a linear guide does not need to be provided to the linear motor 10 according to the embodiment.

Furthermore, in the linear motor 10 according to the embodiment, the fastened portion 71 mainly includes metal. Hence, the fastening member 63 can be fastened more tightly to the fastened portion 71 than in a case where the fastened portion 71 includes resin. Hence, even if the output shaft portion 61 accelerates or decelerates rapidly, the mounting base 70 resists deformation. Therefore, it is easy to accurately move the detected portion 43 along a path parallel to the thrust axis T. Hence, it is easy to maintain the detection accuracy of the detection portion 42.

Preferably, the mounting base 70 is formed by insert molding. In insert molding, the metal fastened portion 71 is placed in a cavity first, and then a resin raw material is poured into the cavity.

As illustrated in FIG. 3, the mounting portion 72 includes a coupling portion 74 and a base portion 75 provided with the mounting surface 73. The coupling portion 74 is coupled to the fastened portion 71, and extends in the direction crossing the thrust axis T. The base portion 75 extends from the coupling portion 74 toward the output side.

In the linear motor 10 according to the embodiment, the base portion 75 is provided at a position folded back to the output side from the counter-output-side end surface 61c of the back output shaft portion 61b. Hence, the dimension of the linear motor 10 in the direction of the thrust axis T can be reduced.

Moreover, the linear head module 1 of the embodiment includes the above-mentioned plurality of linear motors 10. The linear head module 1 includes the housing 11 that supports the movers 60 in such a manner as to be movable in the direction of the thrust axis T.

Figure 4:
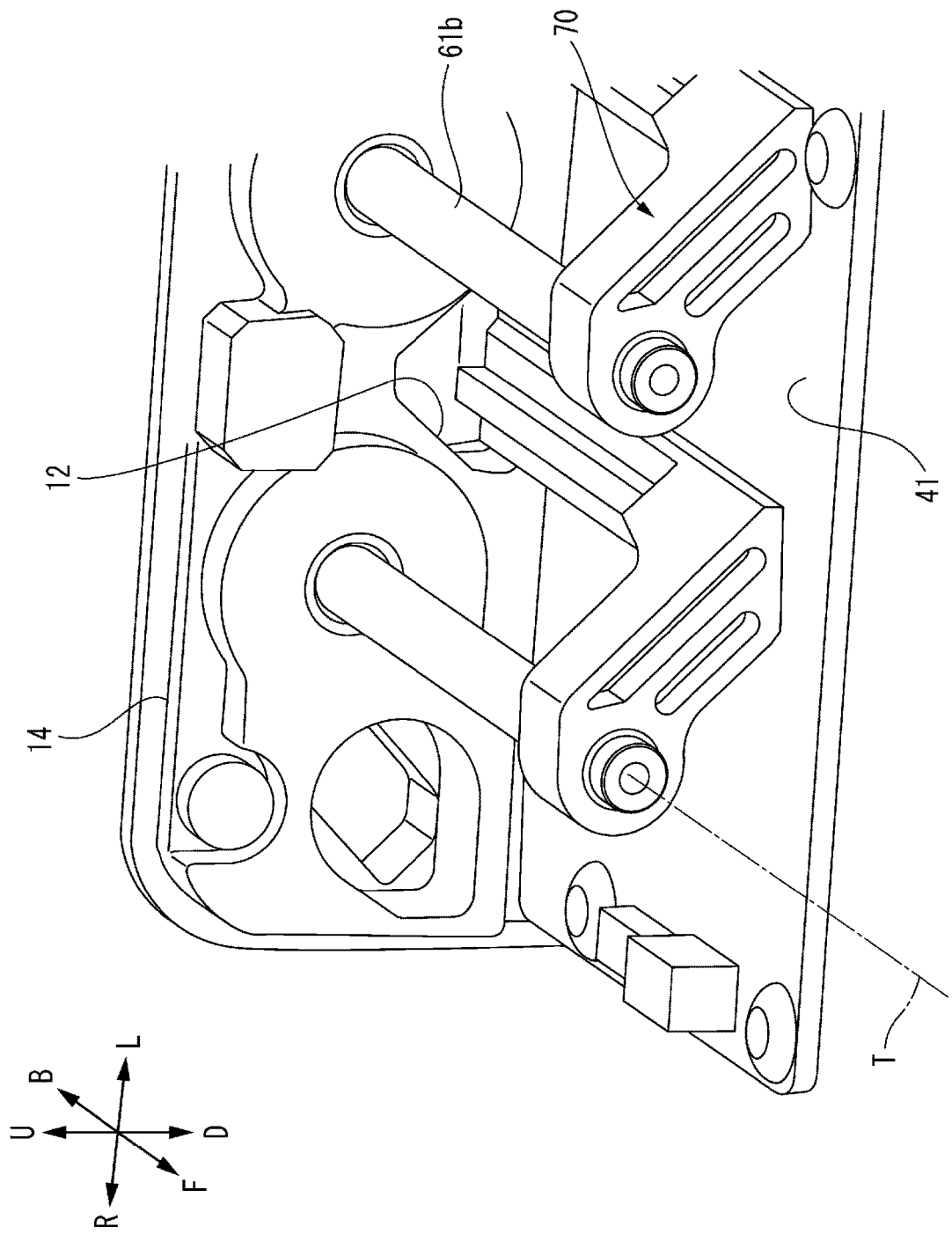
FIG. 4 is an enlarged perspective view illustrating the surroundings of a mounting base.

FIG. 4 is an enlarged perspective view illustrating the surroundings of the mounting base 70. As illustrated in FIG. 4, the housing 11 includes a counter-output-side support wall 14. The counter-output-side support wall 14 is provided on the counter-output side of the thrust axis T. The counter-output-side support wall 14 extends in the direction crossing the thrust axis T, and supports the movers 60 in such a manner as to be movable in the direction of the thrust axis T. The counter-output-side support wall 14 is provided with insertion holes 12 being through-holes. The base portion 75 being at least a part of the mounting portion 72 can be inserted through the insertion hole 12.

In contrast to the illustrated example, if the insertion hole is not provided, when the mover is located at a limit of the range of motion on the output side, the base portion may interfere with the counter-output-side support wall. Hence, it is required to reduce the range of motion of the mover, and/or to increase the dimension of the linear head module in the direction of the thrust axis T. In contrast, in the linear head module 1 according to the embodiment, the base portion 75 can be placed in a space further on the output side than the counter-output-side support wall 14 when the mover 60 is located at the limit of the range of motion on the output side. Hence, it is possible to increase the range of motion of the mover 60, or to reduce the dimension of the linear head module 1 in the direction of the thrust axis T.

Figure 5:
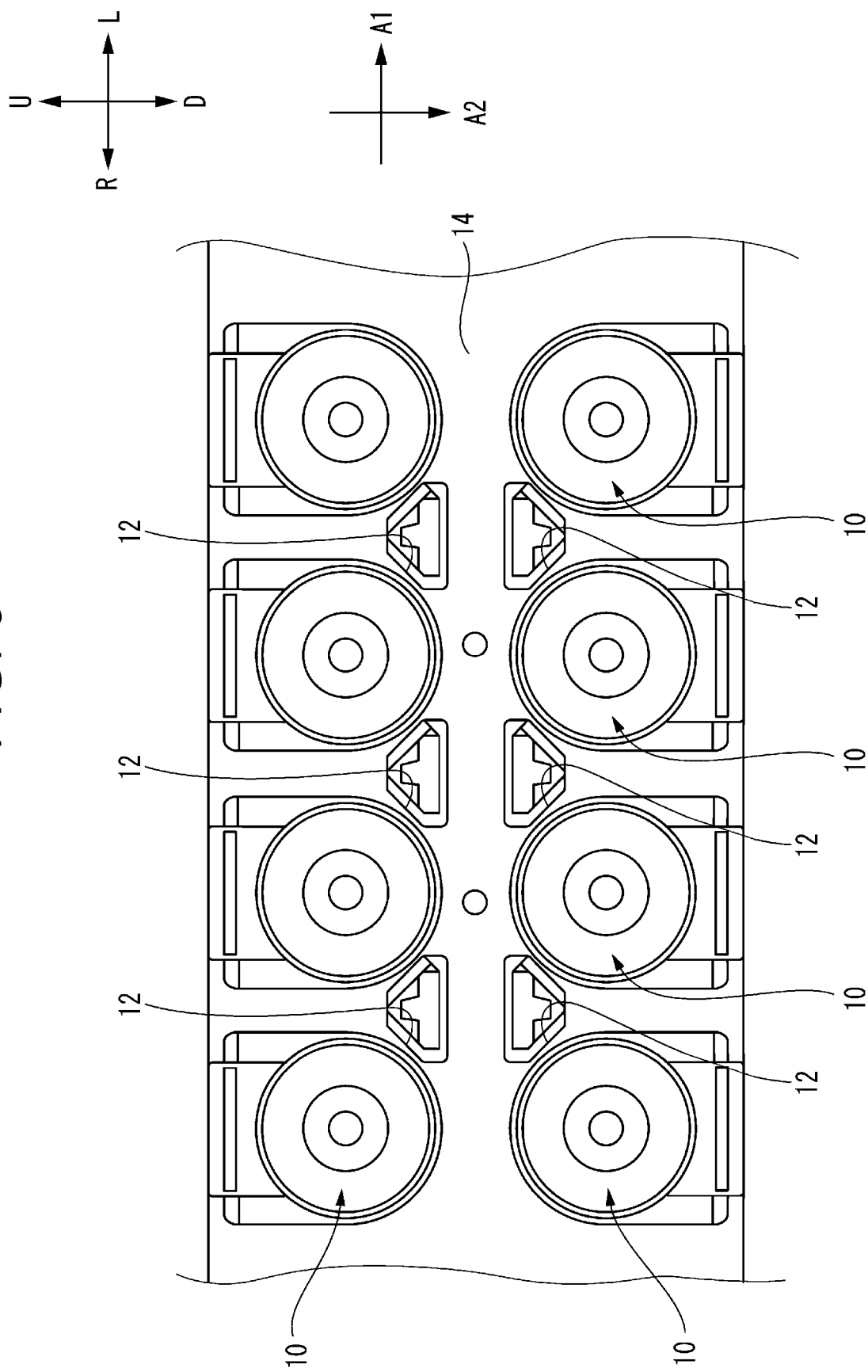
FIG. 5 is a diagram of a counter-output-side support wall as viewed from an output side of the thrust axis.

FIG. 5 is a diagram of the counter-output-side support wall 14 as viewed from the output side of the thrust axis T. In an example illustrated in FIG. 5, the plurality of linear motors 10 is arranged in a first arrangement direction A1 crossing the direction of the thrust axis T. In other words, in the illustrated example, four linear motors 10 are arranged in the left-and-right direction. The insertion holes 12 are each provided between two of the back output shaft portions 61b (refer to FIG. 4) adjacent in the first arrangement direction A1 as viewed in the direction of the thrust axis T.

The linear head module 1 according to the embodiment can provide the spaces for housing the base portions 75, making efficient use of the spaces between the plurality of linear motors 10.

In the example illustrated in FIG. 5, the plurality of linear motors 10 arranged in the first arrangement direction A1 is also arranged in a second arrangement direction A2 crossing the first arrangement direction A1. In other words, four linear motors 10 arranged in the left-and-right direction are provided in each of two rows in the up-and-down direction, and a total of eight linear motors 10 are provided. The insertion holes 12 are each provided between two of four back output shaft portions 61b adjacent to one another in the form of a rectangle as viewed in the direction of the thrust axis T.

The spaces between the plurality of linear motors 10 can be used more efficiently in the linear head module 1 according to the embodiment. Consequently, the spaces for housing the base portions 75 can be provided.

Figure 6:
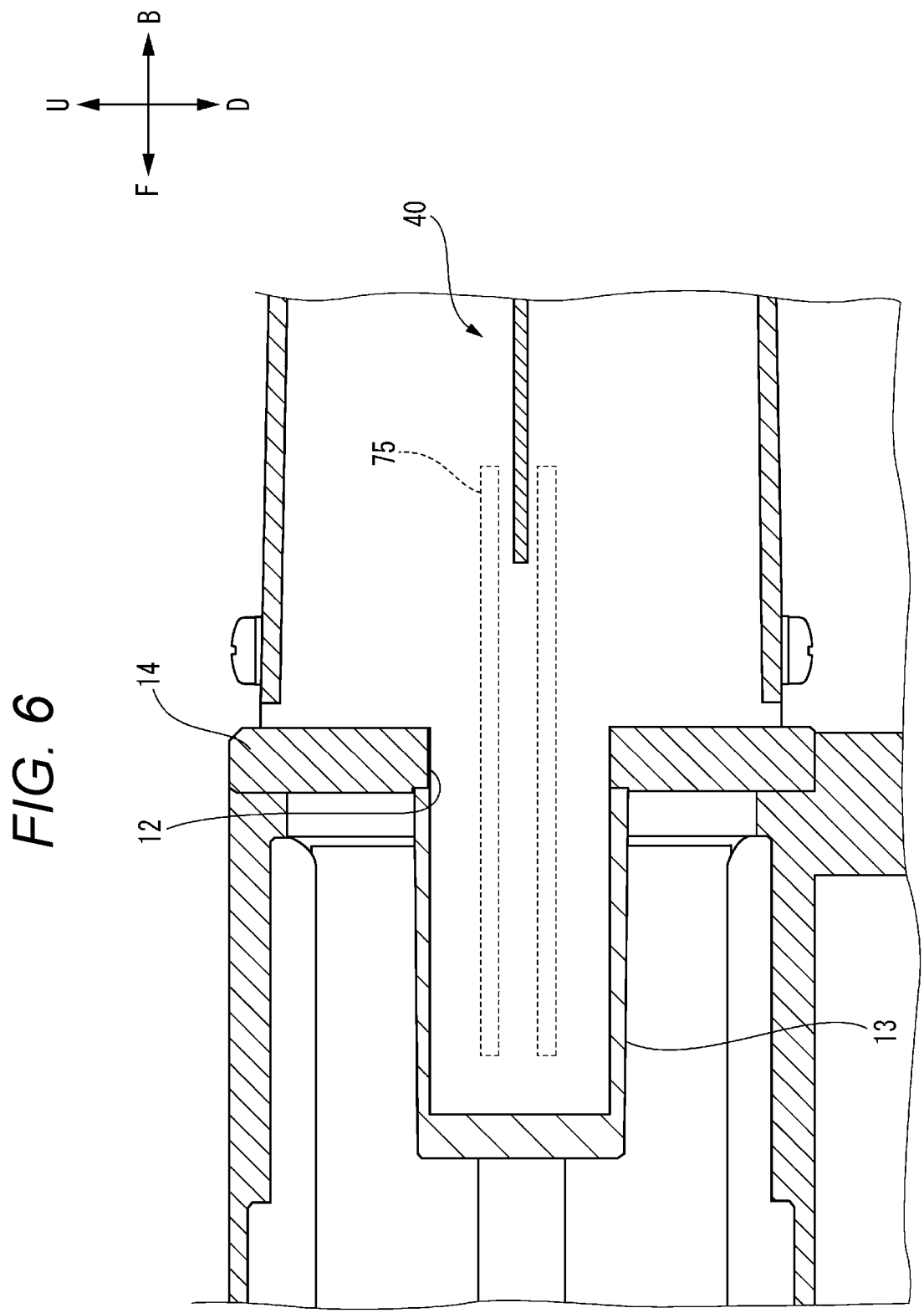
FIG. 6 is a cross-sectional view illustrating the counter-output-side support wall provided with through-holes.

FIG. 6 is a cross-sectional view illustrating the counter-output-side support wall 14 provided with the insertion holes 12. As illustrated in FIG. 6, a dividing cover 13 is provided on the output side of the counter-output-side support wall 14. The dividing cover 13 divides a housing chamber where at least a part of the mounting portion 72, which is exposed from the insertion hole 12, is housed from a space further on the output side than the counter-output-side support wall 14.

As illustrated in FIG. 2, the first bearing 21 and the second bearing 31 are located in the space further on the output side than the counter-output-side support wall 14. A lubricating oil is used for the first bearing 21 and the second bearing 31. If the oil evaporates and adheres to an electronic component, it has an adverse effect on the electronic component. Alternatively, if the oil adheres to the detected portion 43, the sensitivity of the sensor unit 40 may decrease. The provision of the insertion hole 12 may cause the oil content produced in the space further on the output side than the counter-output-side support wall 14 to adhere to the detected portion 43 or the sensing circuit board 41.

The linear head module 1 according to the embodiment is configured in such a manner as to provide the dividing cover 13 to resist the adhesion of the oil to the detected portion 43 and the sensing circuit board 41.

For the convenience of illustration, FIG. 2 does not illustrate the dividing cover 13.

In the linear head module 1 according to the embodiment, a plurality of the detected portions 43 is each provided to the mover 60, and a plurality of the detection portions 42 is provided to a single sensing circuit board 41. Consequently, the number of components can be reduced.

Up to this point the embodiment of the present disclosure has been described. In terms of this, it is needless to say that the technical scope of the present disclosure should not be construed in a limited manner by the description of the embodiment. The embodiment is a mere example. Those skilled in the art understand that various embodiments can be modified in various manners within the technical scope of the present disclosure described in the claims. The technical scope of the present disclosure should be determined on the basis of the scope described in the claims and the scope of equivalents thereof.

Figure 7:
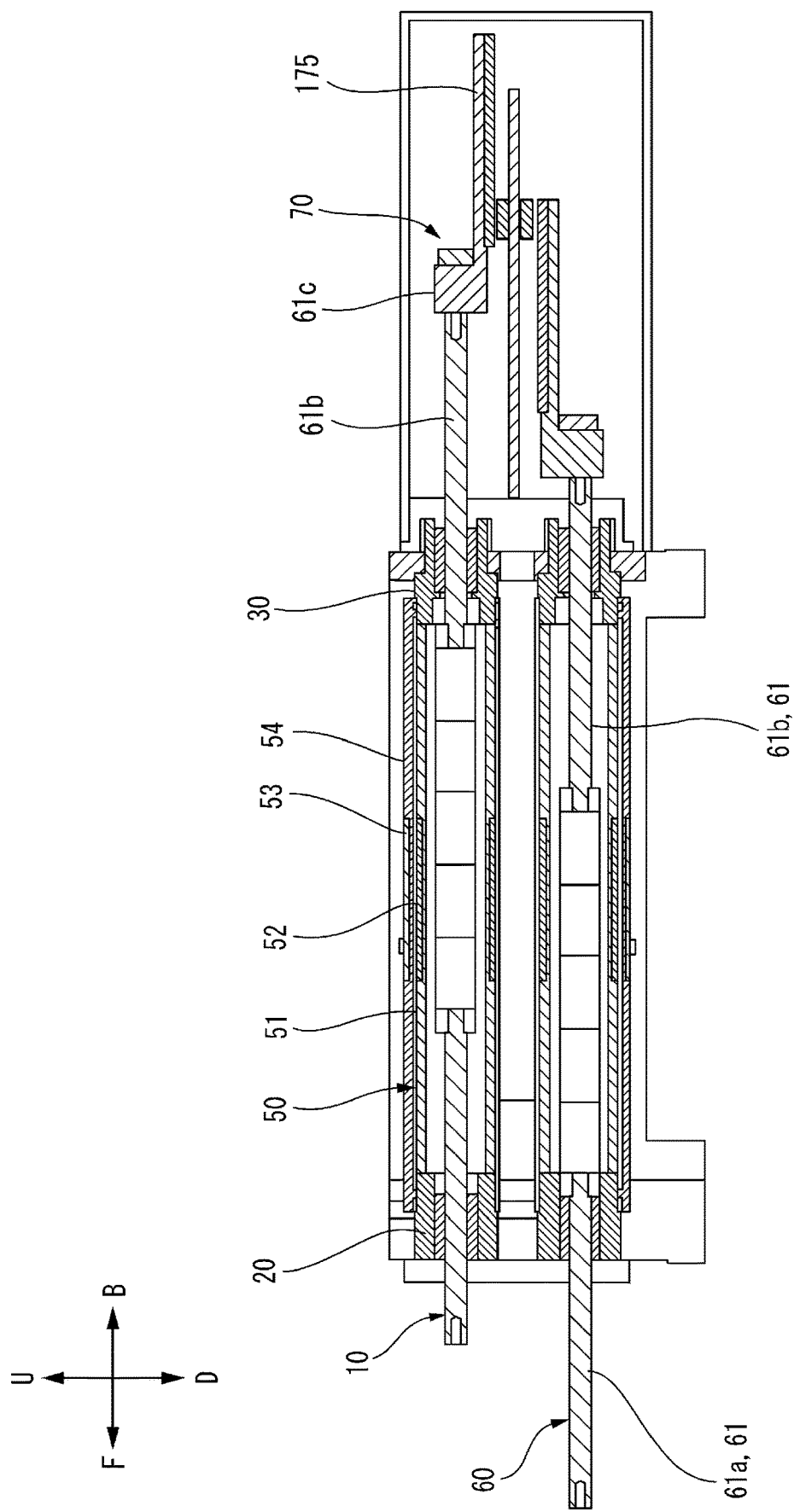
FIG. 7 is a cross-sectional view of a linear head module according to a modification of the present disclosure.

For example, in the above-mentioned embodiment, the base portion 75 has the shape folded back to the output side from the counter-output-side end surface 61c of the back output shaft portion 61b. In terms of this, as in an example illustrated in FIG. 7, a base portion 175 may be configured in such a manner as to extend toward the counter-output side from the counter-output-side end surface 61c of the back output shaft portion 61b.

In the above-mentioned embodiment, the cylindrical magnetic material has been described. In terms of this, the shape of the magnetic material is not limited to a cylinder. The shape of the magnetic material may be, for example, a rectangular prism or plate.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A linear motor comprising:
   a mover including an output shaft portion extending in a direction of a thrust axis;
   a detection portion configured to be capable of detecting a position of the output shaft portion in the direction of the thrust axis; and
   a detected portion fixed to the mover, wherein
   the mover further includes:
   a mounting base to which the detected portion is attached; and
   a metal fastening member that fastens the mounting base to an end surface, on one side in the direction of the thrust axis, of the output shaft portion,
   the mounting base includes:
   a metal fastened portion sandwiched between the end surface, on the one side in the direction of the thrust axis, of the output shaft portion, and the fastening member; and
   a resin mounting portion having a mounting surface to which the detected portion is attached, the mounting surface being provided at a position off the thrust axis,
   the mounting portion includes a coupling portion coupled to the fastened portion and extending in a direction crossing the thrust axis, and
   the mounting surface is provided to a base portion extending from the coupling portion toward another side in the direction of the thrust axis.

2. The linear motor according to claim 1, wherein the mounting base is formed by insert molding.

3. A linear head module comprising:
   a plurality of linear motors; and
   a housing, wherein
   each one of the plurality of linear motors comprising:
   a mover including an output shaft portion extending in a direction of a thrust axis;
   a detection portion configured to be capable of detecting a position of the output shaft portion in the direction of the thrust axis; and
   a detected portion fixed to the mover,
   the mover further includes:
   a mounting base to which the detected portion is attached; and
   a metal fastening member that fastens the mounting base to an end surface, on one side in the direction of the thrust axis, of the output shaft portion,
   the mounting base includes:
   a metal fastened portion sandwiched between the end surface, on the one side in the direction of the thrust axis, of the output shaft portion, and the fastening member; and a resin mounting portion having a mounting surface to which the detected portion is attached, the mounting surface being provided at a position off the thrust axis, the housing is configured to support the movers in such a manner as to be movable in the direction of the thrust axis, the housing includes a counter-output-side support wall, the counter-output-side support wall is provided on the one side in the direction of the thrust axis, extends in a direction crossing the thrust axis, and supports the movers in such a manner as to be movable in the direction of the thrust axis, and the counter-output-side support wall is provided with through-holes through each of which at least a part of the respective mounting portion is insertable.

4. The linear head module according to claim 3, wherein
the plurality of the linear motors is arranged in a first arrangement direction crossing the direction of the thrust axis, and the through-holes are each provided between two of the output shaft portions adjacent in the first arrangement direction as viewed in the direction of the thrust axis.

5. The linear head module according to claim 4, wherein
the plurality of the linear motors arranged in the first arrangement direction is also arranged in a second arrangement direction crossing the first arrangement direction, and the through-holes are each provided between two of four output shaft portions adjacent to one another in a form of a rectangle as viewed in the direction of the thrust axis.

6. The linear head module according to claim 3, wherein
the counter-output-side support wall is provided with a dividing cover on the other side in the direction of the thrust axis, and the dividing cover separates a housing chamber where at least a part of the mounting portion, which is exposed from the through-hole, is housed from a space further on the other side in the direction of the thrust axis than the counter-output-side support wall.

7. The linear head module according to claim 3, wherein
a plurality of the detected portions is each provided to the respective mover, and a plurality of the detection portions is provided to a single circuit board.

* * * * *